United States Patent [19]

Soenen et al.

[11] Patent Number: 5,566,110
[45] Date of Patent: Oct. 15, 1996

[54] ELECTRICALLY ERASABLE PROGRAMMABLE READ ONLY MEMORY AND METHOD OF OPERATION

[75] Inventors: Eric G. Soenen; Loulis J. Izzi, both of Plano; Thomas F. Adkins, Coppell; Roman Staszewski, Garland, all of Tex.

[73] Assignee: Texas Instruments Incorporated, Dallas, Tex.

[21] Appl. No.: 408,661

[22] Filed: Mar. 21, 1995

[51] Int. Cl.⁶ .................................................. G11C 11/40
[52] U.S. Cl. .................... 365/185.07; 365/154; 365/201; 365/189.05
[58] Field of Search .......................... 365/201, 185.01, 365/185.07, 185.14, 185.24, 189.05, 190, 154

[56] References Cited

U.S. PATENT DOCUMENTS

| | | | |
|---|---|---|---|
| 4,400,799 | 8/1983 | Gudger et al. | 365/185.07 |
| 4,979,004 | 12/1990 | Esquivel et al. | 357/23.5 |
| 4,980,859 | 12/1990 | Guterman et al. | 365/185.14 |
| 5,045,489 | 9/1991 | Gill et al. | 437/43 |
| 5,045,490 | 9/1991 | Esquivel et al. | 437/43 |
| 5,051,958 | 9/1991 | Arakawa | 365/185.07 |
| 5,053,839 | 10/1991 | Esquivel et al. | 357/23.5 |

*Primary Examiner*—Tan T. Nguyen
*Attorney, Agent, or Firm*—Robby Holland; Jim Brady; Richard Donaldson

[57] ABSTRACT

An improved electrically erasable read only memory (EEPROM) includes a EEPROM cell and a static random access memory (SRAM) cell. Complementary pairs of complementary metal oxide semiconductor (CMOS) transistors connect the gates of transistors forming the EEPROM cell to either the corresponding data nodes of the SRAM cell or to a fixed read or nonzero test voltage. When formed into an array, it is not necessary to replicate differential sense circuitry in every cell. EEPROM transistor pairs are combined into columns which share a common sense latch. The nonsero test voltage allows for measurement of the actual threshold voltages ($V_T$) of each EEPROM device individually.

7 Claims, 10 Drawing Sheets

ELECTRICALLY ERASABLE PROGRAMMABLE READ ONLY MEMORY AND METHOD OF OPERATION

FIELD OF INVENTION

This invention is in the field of integrated circuits relating to memory devices and more particularly relates to electrically erasable programmable read only memory (EEPROM) memories.

BACKGROUND OF INVENTION

Electrically erasable programmable read only memory (EEPROM) ($E^2$PROM) cells are extremely useful as non-volatile storage elements which have the advantage of being modified in-circuit more than one time. The following U.S. Patents assigned to Texas Instruments Incorporated illustrate EEPROM devices: U.S. Pat. Nos. 4,979,004; 5,053,839; 5,045,489; and, 5,045,490.

The basic EEPROM transistor is a 4-terminal device as illustrated in prior art FIG. 1. The terminals INOUT 1, INOUT 2 and CONTROL are comparable to the DRAIN, SOURCE and GATE terminals of a regular metal oxide semiconductor field effect transistor (MOSFET). The long-term memory effect is obtained through the fact that the threshold voltage ($V_T$) of this MOSFET can be electrically modified by controlling the voltage on the fourth terminal (DIFFUSION).

When a large positive voltage (usually 17 V) is applied to the control input, with respect to the DIFFUSION terminal, the effective $V_T$ of the device is raised (usually to about 5 V). When that same large voltage (programming voltage $V_{PP}$) is applied to the DIFFUSION terminal, with respect to the CONTROL input, the effective $V_T$ is lowered (usually to about −2 V). In the first case, the EEPROM device strongly turns into an "enhancement" mode device. In the second case, it effectively turns into a "depletion" mode device.

Over time, the difference in $V_T$ between the two modes may decrease due to drift. As a result, the EEPROM cells are often programmed and read back differentially, i.e. a one-bit memory cell is built using two EEPROM devices. One is programmed by raising the effective $V_T$, the other one by lowering the effective $V_T$. The cell is read back out by (differentially) comparing the $V_T$ of both devices. This method is much more reliable than attempting to sense a single $V_T$, because even when the two $V_T$'s drift towards each other over time, there usually is at least several tens of milli V difference between them, which can be resolved very reliably by a differential comparator or a latch.

A common way of programming and reading back differential EEPROM cells is illustrated in prior art FIG. 2. To program, the READ line is held low. This disables the cross-coupled latch formed by the top 8 transistors. The DOUT output is forced high. Node A and B (drains of the EEPROM devices) are left floating.

To program a logic 1 into prior art FIG. 2, node D is taken to $V_{PP}$ (17 V) while node DZ is held at 0 V. This raises the $V_T$ of transistor M2 to approximately 5 V and lowers the $V_T$ of transistor M1 to approximately −2 V.

To program a logic 0, node D is held at 0 V, while node DZ is taken to $V_{PP}$. This raises the $V_T$ of M2 to approximately 5 V and lowers the $V_T$ of M2 to approximately −2 V.

In READ mode, nodes D and DZ of prior art FIG. 2 are held at 0 V. The READ line is asserted (taken to a logic high or $V_{DD}$, which is normally around 5 V). This enables the cross-coupled latch (which can be seen as back-to-back NAND gates with EEPROM devices at the bottom 1). The side of the latch which has the higher $V_T$ (most "enhancement" mode) EEPROM device, will obviously be strongly biased towards a logic 1, while the other side will be biased towards a logic 0. Hence, when READ is enabled, the latch will correctly read out the programmed data. The differential scheme insures that the data can be reliably resolved, even when the $V_T$'s of transistors M1 and M2 drift towards each other. During the read operation, both D and DZ are held at ground potential (0 V).

In order to be able to combine a number of EEPROM cells into a larger array, the cell described above with reference to prior art FIG. 2 is often surrounded by additional circuitry as illustrated in prior art FIG. 3. DOUT is now a tri-state output. When READ is a logic 0 (and READZ a logic 1), DOUT is in a high-impedance state. When READ is 1 (and READZ is 0), the cross-coupled latch is activated and DOUT reflects the state of the previous programmed bit.

The high-impedance feature of prior art FIG. 3 is useful in order to combine several basic cells onto one output line (normally all the cells in one column of the EEPROM array). Selecting one specific row of the array is achieved by asserting the particular READ line of that row, while leaving the others at 0.

In prior art FIG. 3, NOR gates N1 and N2 are operated off a different power supply than the rest of the cell, but share ground. They are operated off $V_{PP}$, which is a high voltage supply and therefore they are built with high-voltage devices. PROGZ, D and DZ are high-voltage inputs.

When the array cell is not in write mode, $V_{PP}$ is held at $V_{DD}$ (5 V) and PROGZ is held at 5 V. D and DZ are either 0 V or 5 V. As a result, both the DIFFUSION and the CONTROL terminals of both EEPROM devices are held at 0 V, which is the normal mode for reading.

In order to write the cell of prior art FIG. 3, $V_{PP}$ is taken to the programming voltage level (17 V). D and DZ are either 17 V or 0 V (each other's complement) and PROGZ is held at 0 V. READ is held at 0 V and READZ at 5 V. This causes the correct $V_T$ to be programmed into each EEPROM device. PROGZ of unselected rows is $V_{PP}$.

Prior art FIG. 4 illustrates an EEPROM array using a traditional EEPROM memory cell such as illustrated in prior art FIG. 3 which is manufactured by Texas Instruments Incorporated in device types SN 77715 and SN 104093.

The prior art cell of FIG. 2 has a disadvantage in that there is not convenient method of measuring the $V_T$'s of both EEPROM transistors after programming. The capability to measure the $V_T$'s is important in order to determine the integrity of the programmed data over time. As long as one transistor has a sufficiently higher $V_T$ than the other one (ideally, one device should have positive $V_T$, or operate in enhancement mode, while the other one has a negative $V_T$, or operates in depletion mode) correct reading of the data is possible.

It is well-known, however, that over time, the $V_T$'s of the differential cell tend to drift towards each other, thus compromising the reliability of the programmed data (data retention loss or DRL). In order to guarantee a product that will maintain its programmed data over a long time (e.g. −10 years), it is important to measure the difference in $V_T$ of every cell used in a circuit, before the product is shipped to the customer.

It is conceivable to put a limited number of test structures on a die or on a wafer. Measurement of the $V_T$'s of these test structures (after programming) could be seen as representative for the whole array. But clearly, this simplified method (the main array cells do not contain measurement circuitry) is inferior, since one or two cells could have inferior programming characteristics, while most other ones are good.

It is accordingly an object of the invention to provide a EEPROM wherein the threshold voltages of each EEPROM cell may be individually measured.

Further objects and benefits of the invention will be apparent to those of ordinary skill in the art having the the benefit of the description and drawings following herein.

SUMMARY OF INVENTION

An improved cell allows $V_T$ threshold measurements on all the EEPROM devices used in the array, without additional circuit complexity. The EEPROM cell (two EEPROM transistors) is combined with a traditional static RAM cell (two back-to-back CMOS inverters and two NMOS pass transistors). The RAM cell is arrayed in a conventional way, using two data lines per column. This provides fast access temporary data storage. Two complementary CMOS switches are used to connect the gates of the EEPROM devices either to the corresponding data nodes of the RAM cell (program mode) or to a fixed read or test voltage (read mode). Programming of the whole EEPROM array is achieved by raising the supply voltage to the RAM cells while in the program mode. Reading of an individual EEPROM cell is accomplished through differential read lines which are common to one array column, and sensed using a differential latch.

As contrasted with previous approaches, an auxiliary RAM cell ("shadow RAM") is added to each pair of EEPROM devices. The shadow RAM is used as a level shifter to apply the (high) programming voltage. The differential sense circuitry is not replicated in every cell. EEPROM transistor pairs are combined into columns (through NMOS pass transistors) which share a common sense latch. A fixed test voltage is used to sense the $V_T$ difference within a differential cell. This voltage does not have to be equal to 0 V, as with conventional cells. Sweeping the test voltage allows for the measurement of the actual $V_T$ values of each EEPROM device individually.

The solution thus provides a more compact array, easier programming as bulk programming shortens program time, and easier interface to a micro-controller. The shadow RAM can be used as regular RAM cells when EEPROM is not in use. Non-zero sensing voltage provides more reliable reading of logic state. Absolute value of individual $V_T$'s can be read, which is crucial for monitoring of reliability and life time.

DETAILED DESCRIPTION OF PREFERRED EMBODIMENT

Figure 1:
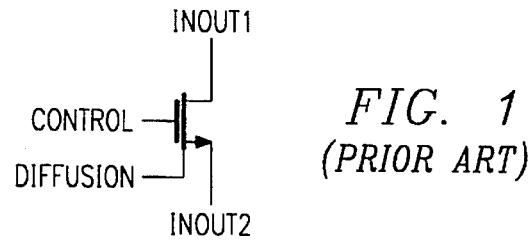
FIG. 1 shows a prior an basic EEPROM transistor.
Figure 2:
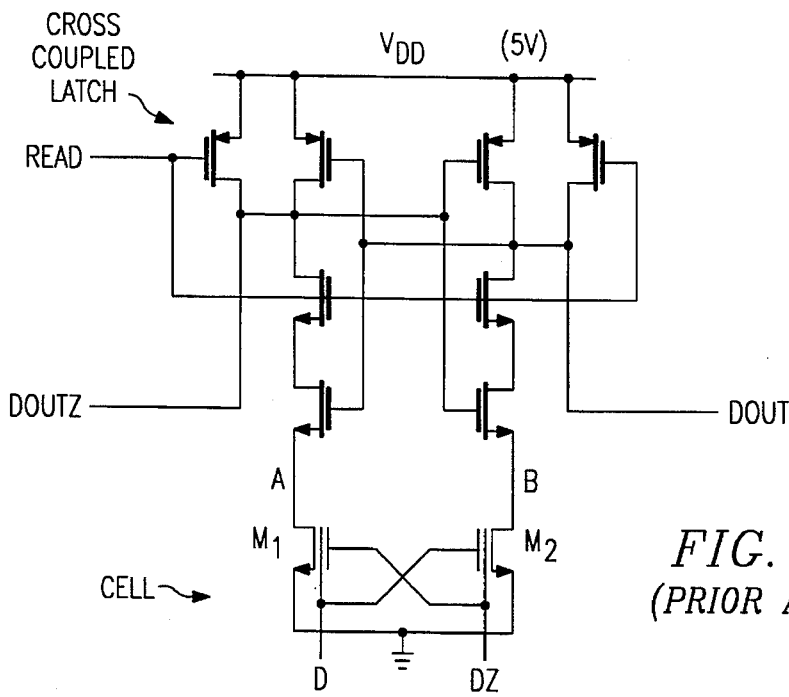
FIG. 2 shows a prior art differential EEPROM cell.
Figure 3:
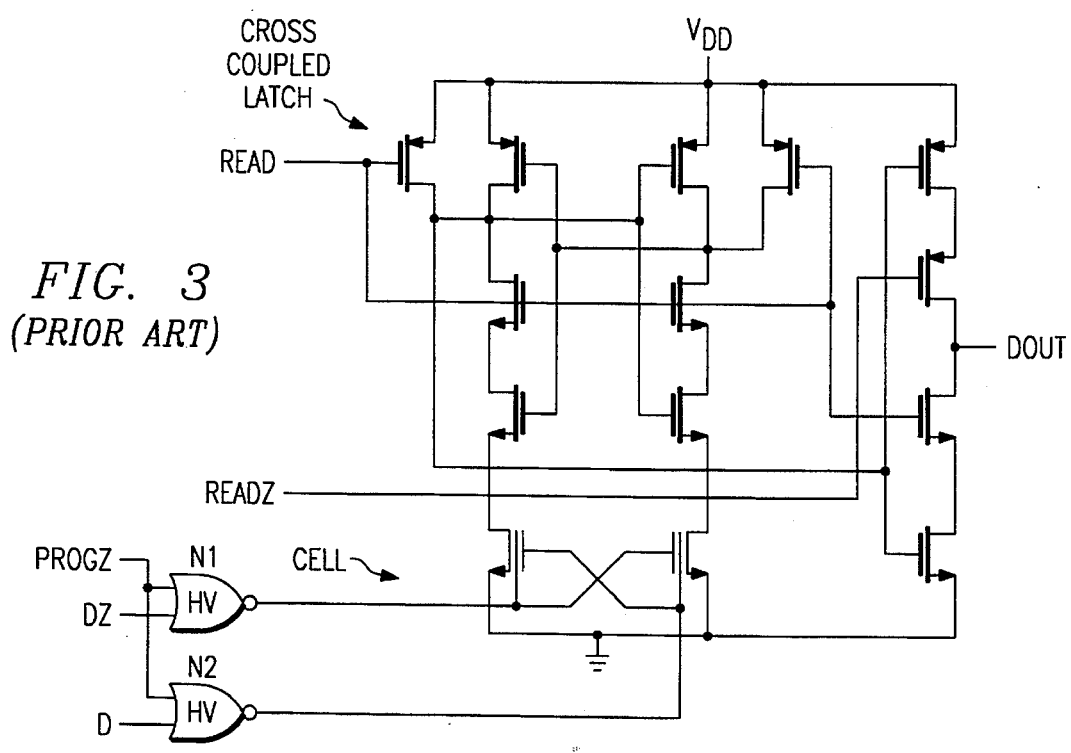
FIG. 3 shows the prior art differential EEPROM cell of FIG. 2 with additional circuitry.
Figure 4:
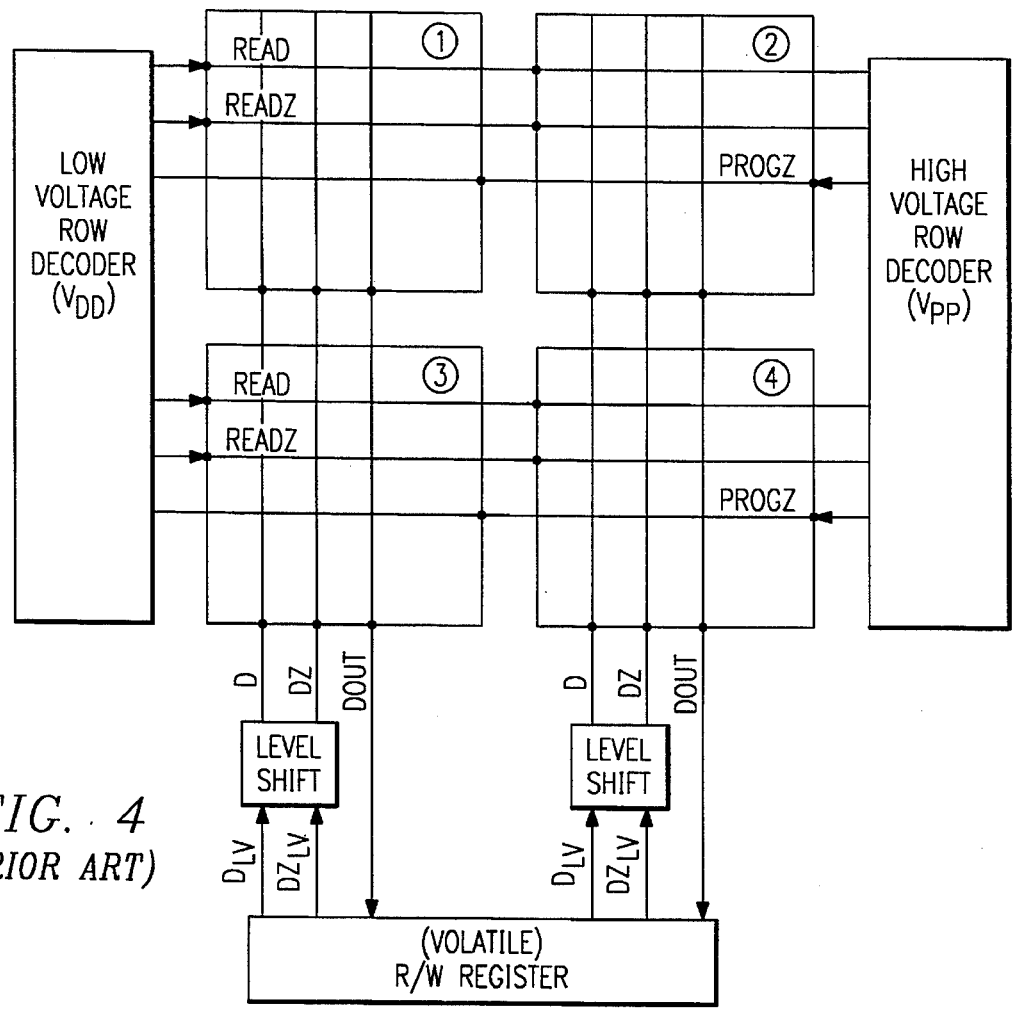
FIG. 4 shows a prior an EEPROM array formed from FIG. 3
Figure 5:
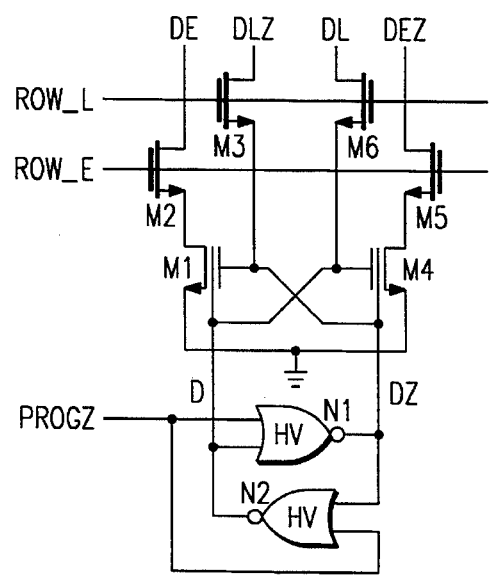
FIG. 5 shows an improved EEPROM cell.

FIG. 5 illustrates an improved EEPROM cell. When $V_{PP}$ is 5 V (nominal $V_{DD}$) and PROGZ is 0 V, NOR gates N1 and N2 act as a static latch (one-bit static RAM cell). This RAM cell (volatile in nature) can be accessed by bringing the ROW_L line to $V_{DD}$ (logic 1). This enables (high voltage) pass transistors M3 and M6. The latch can be written or read like a regular static random access memory (SRAM) cell.

In FIG. 5, when PROGZ=$V_{PP}$ (either 5 V or 17 V) latch outputs D and DZ are pulled to ground. Enabling pass transistors M2 and M5 makes it possible to access the two EEPROM devices, M1 and M4

To WRITE to SRAM, PROGZ=0 V, $V_{PP}$=5 V, ROW_L=5 V, ROW_E=X The cell is written by pulling either DLZ (for a 1) or DL (for a 0) to ground, using an external NMOS device. (NOTE: N1 and N2 must be sized correctly in order to be able to override their inputs through M3 or M6).

To READ to the SRAM of FIG. 5, PROGZ=0 V, $V_{PP}$=5 V, ROW_L=5 V, ROW_E =??. The cell is read like an ordinary SRAM cell would be, with or without the use of an external sense amplifier. A method without sense amplifier consists of precharging the DL and DLZ lines high before asserting ROW_L. When ROW_L is asserted, M3 and M6 turn on, and either DL or DLZ are forced to 0 by the latch.

To WRITE to the EEPROM of FIG. 5, PROGZ=0 V, $V_{PP}$=17 V, ROW_L=X, ROW_E=0. One can verify that when $V_{PP}$ is increased from 5 V to 17 V, one of the two EEPROM devices will be programmed to a high $V_T$, while the other one is programmed to a low $V_T$, depending on the previous state of SRAM latch N1–N2. In other words, increasing $V_{PP}$ from 5 V to 17 V copies the contents of the SRAM cell into the EEPROM cell. As opposed to the traditional approach, a whole array of the improved cells can be programmed into EEPROM at once (bulk programming).

Figure 6:
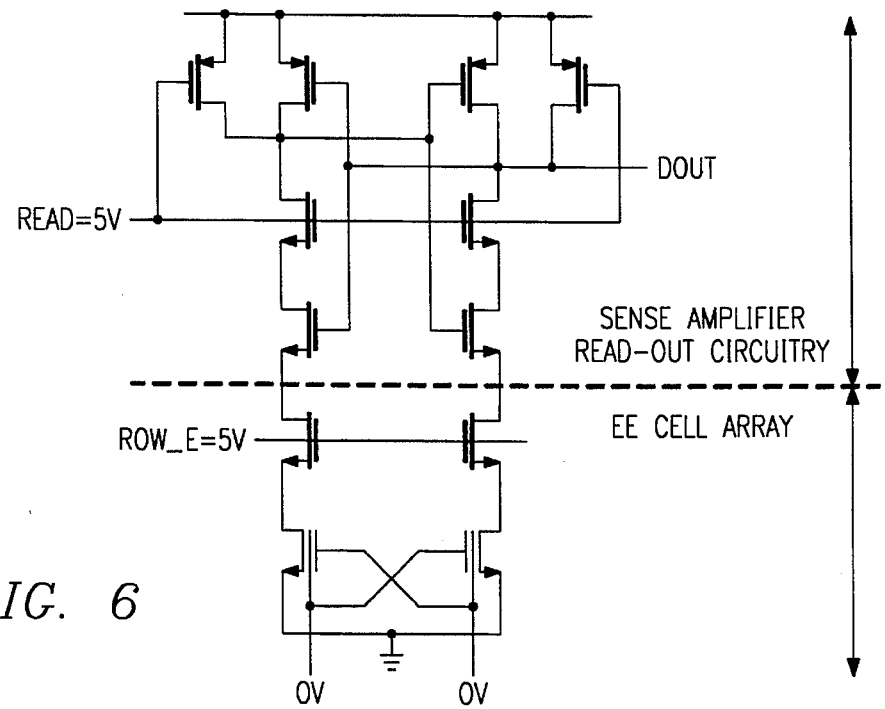
FIG. 6 shows the improved EEPROM cell of FIG. 5 with an external cross-coupled latch (sense amplifier) connected to it.

To READ to the EEPROM of FIG. 5, PROGZ=$V_{PP}$ (normally 5 V), ROW_L=X, ROW_E=5 V. Bringing PROGZ high grounds the two outputs of the SRAM latch, D and DZ. Pass transistors M2 and M5 are turned on, which brings the EEPROM drains onto the read column lines DE and DEZ. An external cross-coupled latch (like incorporated into each traditional EEPROM cell) can be used to sense the difference in $V_T$ between M1 and M4 and read out the data as illustrated in FIG. 6. It should be noted that reading the EEPROM cell causes the data in the corresponding SRAM location to be lost. In many cases, however, this is not a major draw-back.

Figure 7:
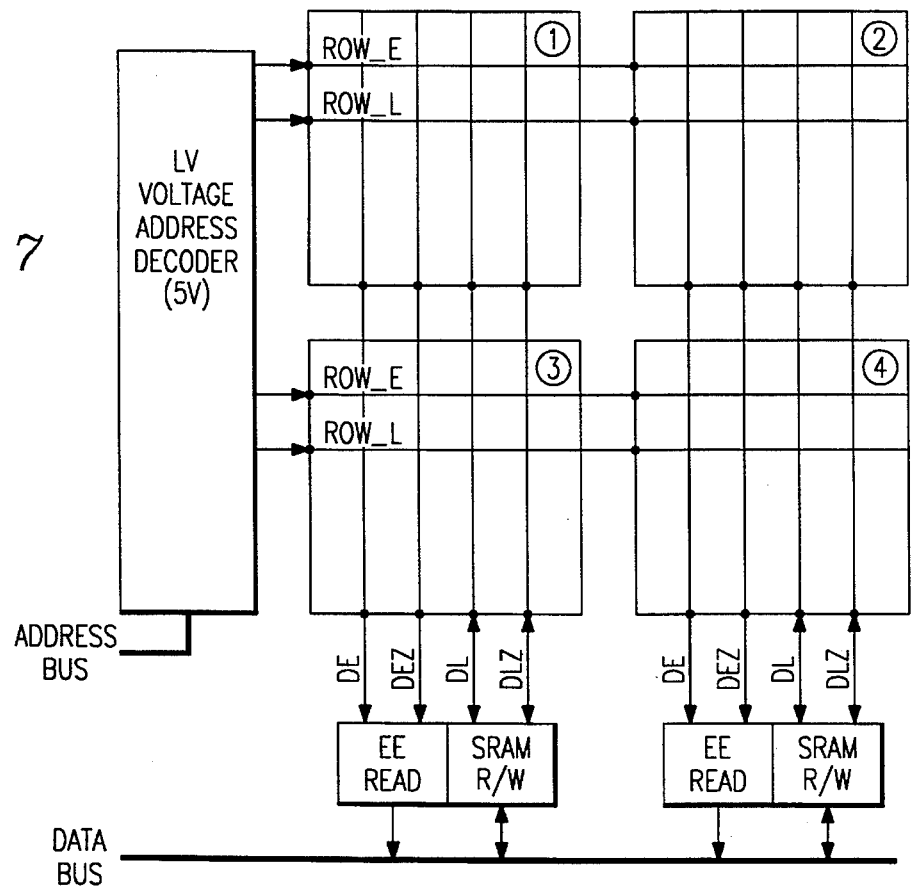
FIG. 7 shows an improved EEPROM array formed from FIG. 6.

FIG. 7, shows how the EEPROM cells of FIG. 5 can be memory-mapped (e.g. for a micro-controller configuration). In this configuration, SRAM and EEPROM have separate addresses, i.e. any of the two can be accessed by a READ operation, since there are separate decoded row lines for ROW_L and ROW_E. If it is not necessary to read the SRAM locations back, ROW_L and ROW_E can be combined to one line, ROW. In that case, the following truth table should be used in the row decoder, to generate the different modes of operation:

| MODE | ROW | PROGZ | $V_{PP}$ |
|---|---|---|---|
| write SRAM | 5 V | 0 V | 5 V |
| ( read SRAM | 5 V | 0 V | 5 V ) |
| write EEPROM | 0 V | 0 V | 17 V |
| read EEPROM | 5 V | 5 V | 5 V |
| NOOP (No oper.) | 0 V | 0 V | 5 V |

In the configuration shown in FIG. 7, $V_{PP}$ and PROGZ are common to the whole array. As a result, bulk programming of all cells will occur, and all SRAM data will be lost each time one EEPROM cell is read. However, variations are possible, e.g. if PROGZ is decoded on a row by row basis, reading of EEPROM data for that row will only result in the loss of SRAM data for that same row (e.g. one row could represent one byte). Even if PRO GZ is decoded on a row by row basis, bulk programming of all EEPROM cells is still possible.

Advantages of the above described improved method include:

a smaller unit cell (6 transistors+2 NOR gates, vs. 14 transistors+2 NOR gates);

single row decoder (low voltage) instead of low voltage+ high voltage decoder;

built-in SRAM cell, no need for additional row-wide read/write buffer;

SRAM cell can be used for other purposes when EEPROM is not being programmed;

possibility to perform bulk programming of the whole array at once. Since a high-voltage $V_{PP}$ pulse needs to be applied for several milliseconds to ensure proper programming (as opposed to less than a microsecond for a read), significant time is saved when programming the array; and the new array method is much more appropriate for memory-mapping of EEPROM cells (micro-controller applications).

In a single MOS transistor, $V_T$ can be measured by maintaining a fairly constant drain-source voltage, while varying the gate voltage, $V_{GS}$. If the drain-source voltage $V_{DS}$ is large enough to maintain the transistor in saturation ($V_{DS} > V_{GS} - V_T$), the relationship between $V_{GS}$ and the drain current, $I_D$, is roughly quadratic:

$$I_D \approx K^1 \frac{W}{L} (V_{GS} - V_T)^2 \text{ for } V_{GS} > V_T \approx 0 \text{ for } V_{GS} < V_T$$

In the case of enhancement-mode transistors ($V_T > 0$); $V_T$ can be detected very easily as the voltage from which a significant drain current begins to flow.

However, for depletion-mode transistors ($V_T < 0$), this method would require applying negative $V_{GS}$ voltages, which can be difficult within a circuit where the source is already at the lowest potential.

Figure 8:
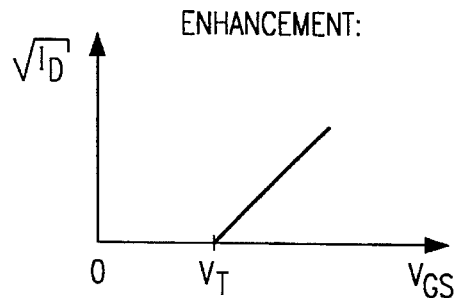
FIG. 8 is a graph of enhancement operation.
Figure 9:
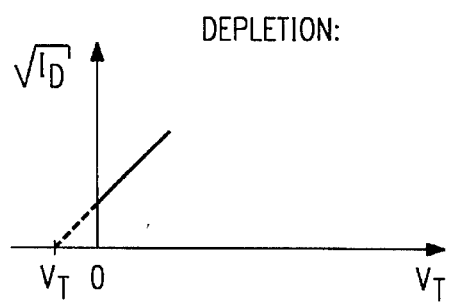
FIG. 9 is a graph depletion operation.

Therefore, the measurement is often done by extrapolation. For a few different $V_{GS}$ values, $I_D$ is noted. Since the square root of $I_D$ is roughly proportional to $V_{GS}$, $V_T$ can easily be found by linear extrapolation as illustrated in FIGS. 8 and 9.

EEPROM devices are different from regular MOS transistors in the sense that they have an additional "diffusion" terminal. If a large enough voltage is applied between gate and diffusion, alteration of $V_T$ ("programming") will occur. As a result, EEPROM devices must be configured in such way that during the $V_T$ measurement, diffusion and gate are at the same potential.

Figure 10:
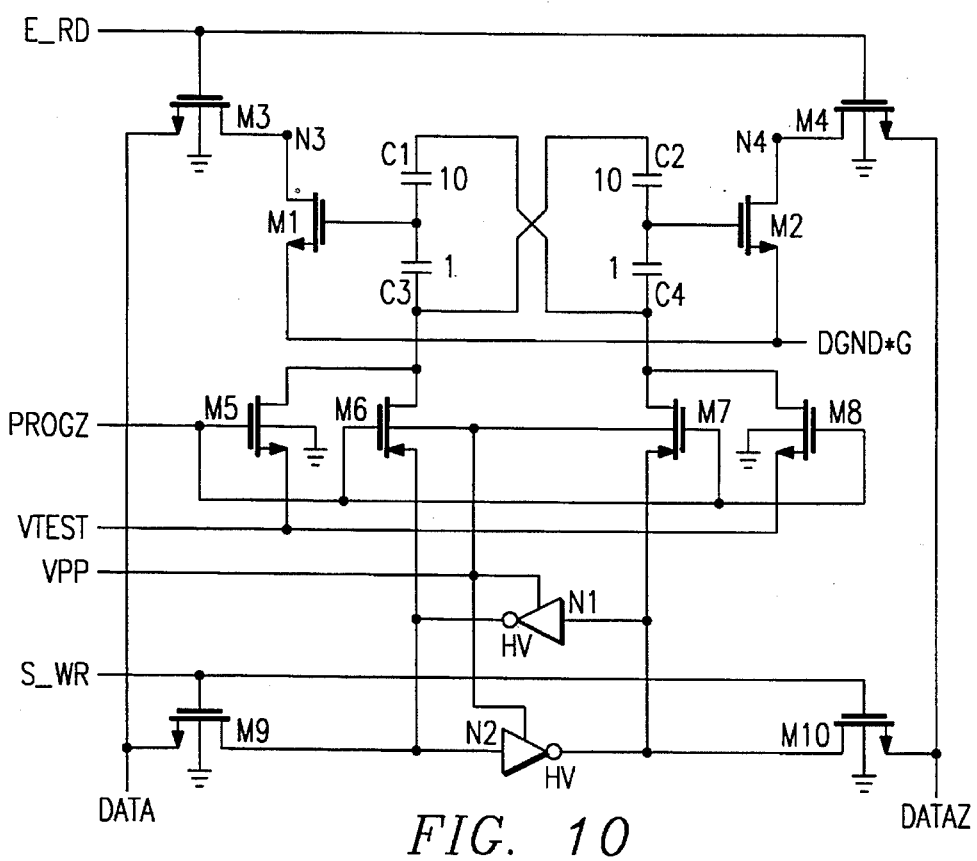
FIG. 10 shows a schematic of an improved EEPROM cell according to the preferred embodiment of the invention.

FIG. 10 is a drawing illustrating the preferred embodiment of invention. High voltage inverters N1 and N2 form a standing static RAM cell, connected to common column lines DATA and DATAZ through row select transistors M9 and M10.

Transistors M1 and M2 of FIG. 10 are the EEPROM latch devices. They can be read as described previously through row select transistors M3 and M4. This requires that both gates and diffusions of M1 and M2 be connected to ground potential. This is achieved by bringing the PROGZ line to 5 V and the VTEST line to zero, while maintaining $V_{PP}$ at 5 V. This combination of voltages turns NMOS multiplexing switches M5 and M8 on, while turning PMOS switches M6 and M7 (whose back-gate is $V_{PP}$) off. Capacitors C1 and C2 are sized larger than capacitors C3 and C4, about 10 times in the preferred embodiment. Transistors M1 and M2 have thin gate oxides (about 100 Å) which allow their gates to float. The smaller capacitors C3 and C4 will drop most of the voltage. The gate oxide of transistors M1 and M2 have a tunneling effect which charges the larger capacitors C1 and C2. When the voltage drops, the tunneling stops and the gates float.

In order to program the EEPROM latch of FIG. 10, PROGZ is brought low. This connects the terminals of the EEPROM transistors to the static SRAM cell instead of VTEST. Bringing $V_{PP}$ to the required programming voltage (12–17 V) boosts the inverter output voltages to the level required to program the EEPROM devices. The fact that PMOS transistors (M6, M7) are used as switches presents no problem since the high level ($V_{PP}$) is passed correctly, while the low level is already present on the EEPROM gates from before PROGZ was asserted.

In the device of FIG. 10, when PROGZ and $V_{PP}$ are held at equal potential, (normally 5 V), both the gates and the diffusions of transistors M1 and M2 are connected to the test voltage VTEST. When E_RD is activated (to select that particular row of EEPROM cells), the $I_D$ current of M1 and M2 becomes available on the DATA and DATAZ lines, where it can be used to perform a $V_T$ measurement. It should be noted that VTEST must be between 0 V and one NMOS $V_T$ below PROGZ in order to be correctly passed to transistors M1 and M2. If $V_T$ measurements in excess of ±4 V are needed, one might have to bring PROGZ above 5 V.

A truth table for the operating modes of the device of FIG. 10 is presented below:

| MODE | E_RD | S_WR | PROGZ | VTEST | $V_{PP}$ |
|---|---|---|---|---|---|
| write SRAM | 0 V | 5 V | 5 V | X | 5 V |
| read SRAM | 0 V | 5 V | 5 V | X | 5 V |
| program EEPROM | 0 V | 0 V | 0 V | X | 12–17 V |
| read | 5 V | 0 V | 5 V | 0 V | 5 V |

| MODE | E_RD | S_WR | PROGZ | VTEST | $V_{PP}$ |
|---|---|---|---|---|---|
| EEPROM IDLE | 0 V | 0 V | 5 V | 0 V | 5 V |
| $V_T$ TEST | 5 V | 0 V | 5 V | (SWEEP) | 5 V |

NOTE:
Structure must be powered up with PROGZ = V??

Some of the advantages of the circuit of FIG. 10 include the following:

the proposed structure allows $V_T$ measurement of every transistor in the array;

low transistor count: (8 NMOS, 4 NMOS, 2EEPROM→14 total);

static RAM can now be read and written independently from EEPROM latch. Reading EEPROM data does not require losing SRAM data; and bulk programming still possible.

Figure 11:
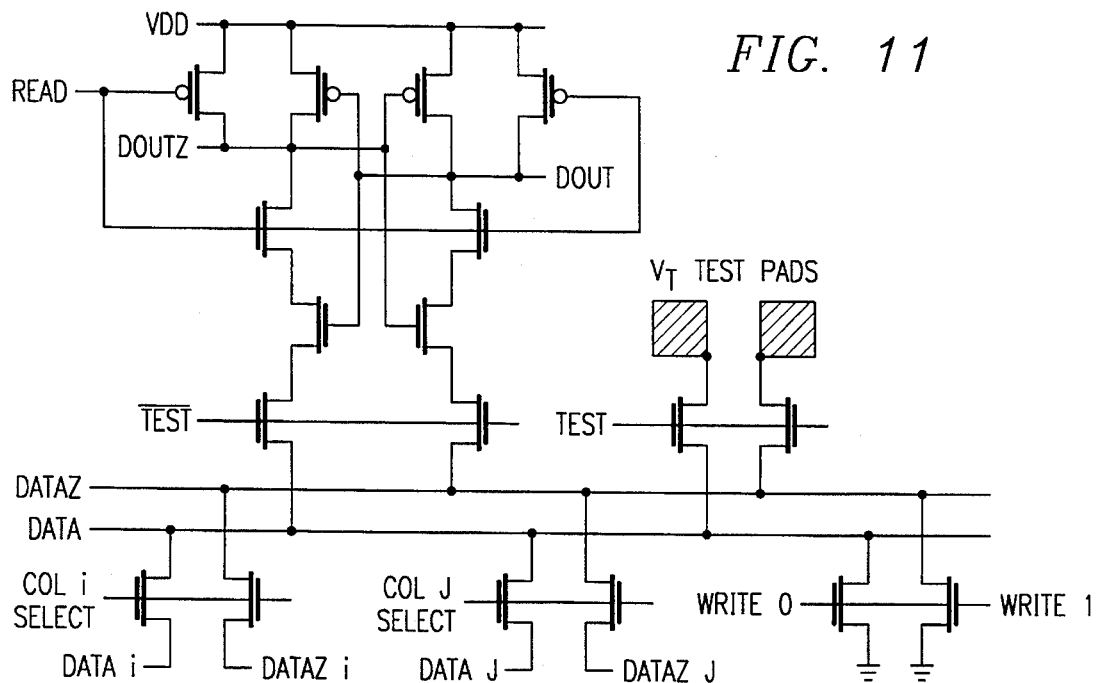
FIG. 11 shows a column decoding and sense amplifier scheme for the preferred embodiment EEPROM cell of FIG. 10.

In FIG. 10, the differential latch used to read the EEPROM data can also be used to read the SRAM data. This results in a an implementation shown in FIG. 11 which connects several columns to a sense amplifier. In FIG. 11, it is to be noted that possible reset circuitry to equalize initial voltages on parasitic capacitances is not shown for clarity.

The structure of FIG. 10 could still possibly result in undefined data if both EEPROM transistors ended up with positive $V_T$ (both transistors are enhancement). In that case, reading the structure out with both gates held at ground potential (0 V gate voltage and 0 V diffusion voltage) would result in both EEPROM transistors being OFF, which means that the latch decision would be undefined. A possible solution to this problem would be to hold the threshold "test" voltage VTEST line at some potential higher than 0 V during read. This will ensure that at least one (and most likely both) of the EEPROM transistors would be ON during read, which results in correct differential read-out.

In order to read the differential EEPROM cell of FIG. 10 out correctly, one has to make sure that parasitic capacitance on the column lines (DATA and DATAZ) is neutralized. If not, stored charge on the DATA of DATAZ line resulting from a previous READ or WRITE operation could make the read-out latch make the wrong decision. This can be eliminated by making sure that before any READ, the DATA and DATAZ lines of the concerned column are pre-charged to a common voltage.

If DATA and DATAZ on FIG. 10 are pre-charged, high (e.g. positive supply), subsequent enabling of the E_RD line will turn one or both of the EEPROM devices on, which results in the strongest (lowest $V_T$) of those devices pulling the column line low the quickest. This difference is then amplified by the latch.

The sense amplifiers shown in the implementation of FIG. 11, however, have draw-backs. In order to operate correctly, they require the DATA and DATAZ line of the EEPROM array to be pre-charged. The pre-charge operation eliminates any bias towards either a logic 1 or a logic 0, due to charge that may have been accumulated on the DATA and DATAZ line during a previous read or write operation. In the given example, all column lines would have been pre-charged high, which is the optimum initial condition for the sense amplifier latch.

However, the pre-charge values will cause nodes N3 and N4 (drains of the EEPROM devices) in the preferred embodiment of FIG. 10 to momentarily see a voltage equal to the logic supply. The voltage difference between source (0 V) and drain of the EEPROM devices therefore can reach 5 V (or whatever the logic supply voltage is). It is known that such a source-drain potential can interfere with the correct operation of the EEPROM devices (by generating electrons that can end up on the floating gate). For reliable operation, it is recommended never to exceed a few hundred mV of source-drain voltage.

Figure 12:
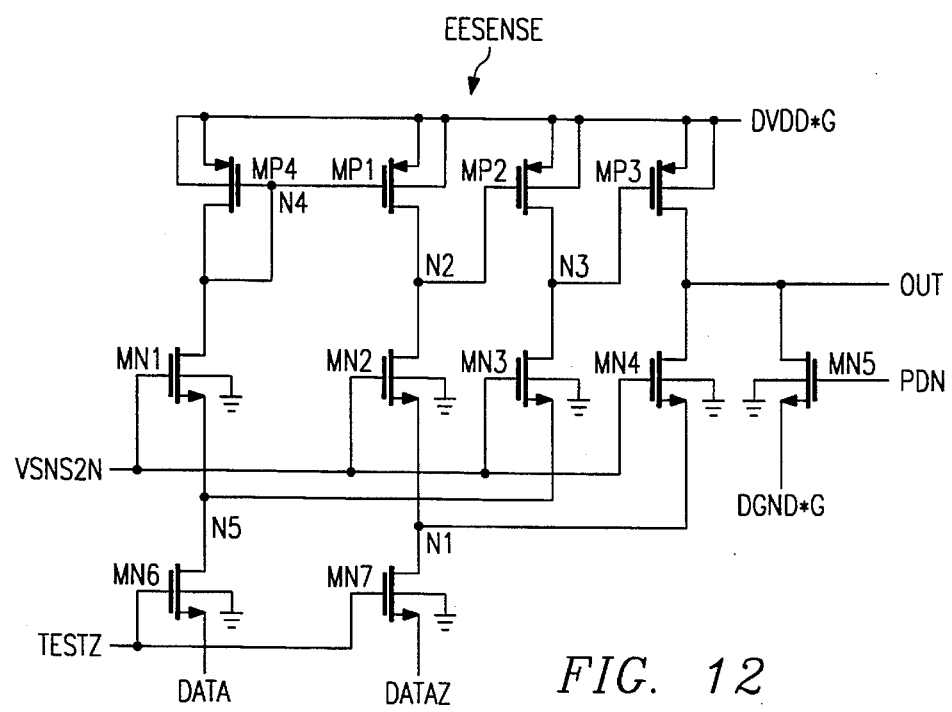
FIG. 12 shows a schematic of a preferred embodiment sense amplifier for use with the preferred embodiment EEPROM cell of FIG. 10.

Therefore, the preferred embodiment of a sense amplifier EESENSE used with the EEPROM of FIG. 10 is illustrated in FIG. 12. The line labeled "VSNS2N" is a bias voltage line, which keeps NMOS transistors MN1, MN2, MN3 and MN4 biased at a certain nominal current (in this case, 2 uA) when their sources are held at 0 V. PMOS transistors MP4 and MP1 form a current mirror, which together with MN1 and MN2 form a current comparator. NMOS transistors MN6 and MN7 are pass transistors, whose impedance is low when the TESTZ line is high. The currents to be compared (flowing towards the bottom of the schematic) are applied to the sources of MN6 and MN7, respectively. When the current applied to DATAZ exceeds the current applied to DATA, node N2 is pulled low. Otherwise, N2 is high. Additional gain is provided in the current comparator through two gain stages, MP2/MN3 and MP3/MN4, respectively. NMOS transistor MN5 is used to avoid floating nodes in power-down mode and is not part of the current comparator.

The current comparator sense amplifier of FIG. 12 determines the logic state of the appropriate EEPROM cell in the array by comparing the currents sunk by the two EEPROM devices. Since the EEPROM devices are connected to the common-gate sense circuitry of the current amplifier through pass transistors, their source-drain voltage difference always remains limited. Indeed, when on, the EEPROM devices only operate in the triode region of a MOS transistor.

Figure 13:
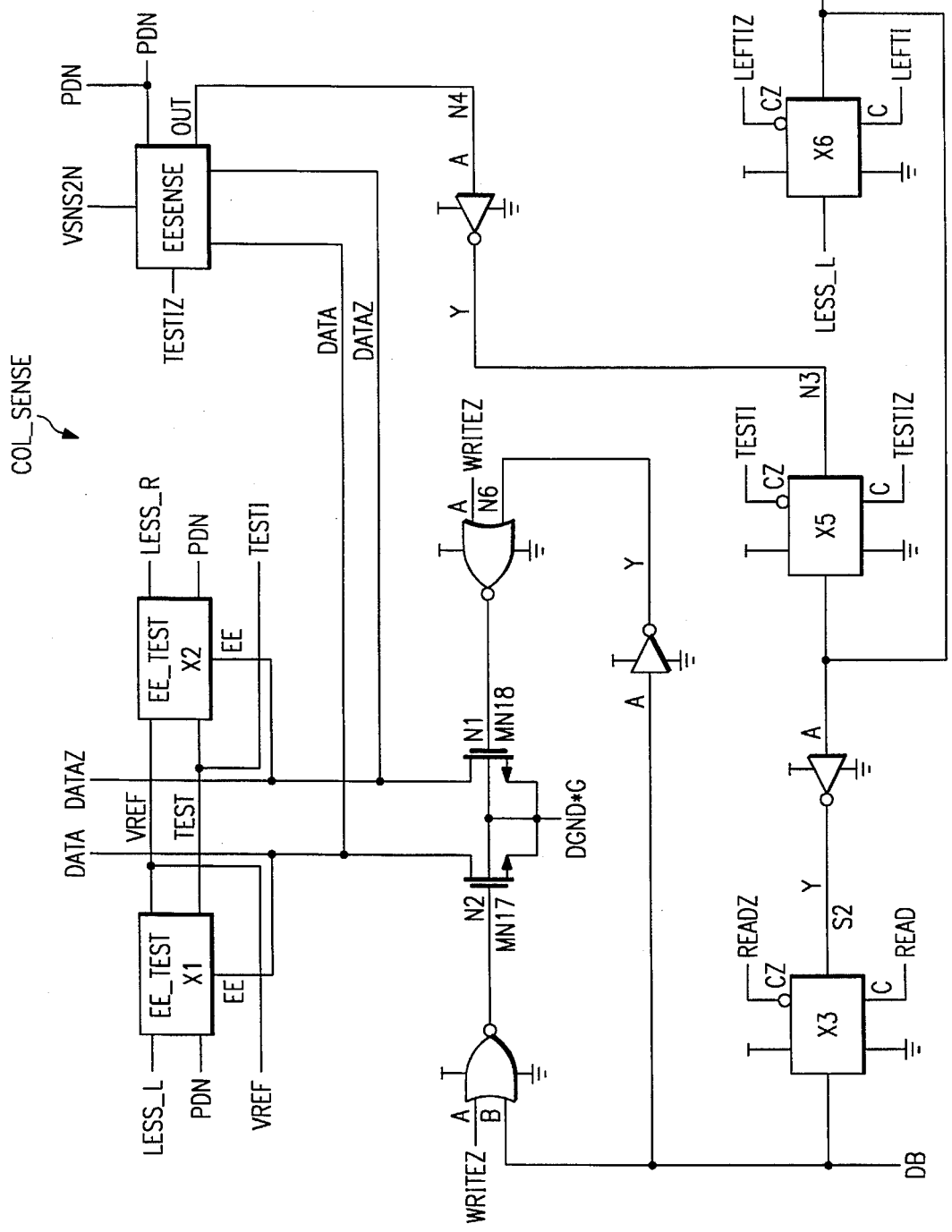
FIG. 13 shows a full sense circuit for one bit a preferred embodiment EEPROM memory.

FIG. 13 shows the complete sense circuitry COL_SENSE associated with one bit of EEPROM memory in the preferred embodiment. DB represents one bit of a bidirectional data bus used to interface the memory to a controlling main processing unit (MPU). In write mode (WRITEZ low), either the DATAZ or the DATA line is pulled low by NMOS transistor MN1 or MN18, depending on the current state of the databus. In read mode (WRITEZ high, TESTI low, TESTIZ high), the previously discussed sense amplifier X13 is active, and its logic output is placed on the databus by transmission gate X3.

Figures 14, 16:
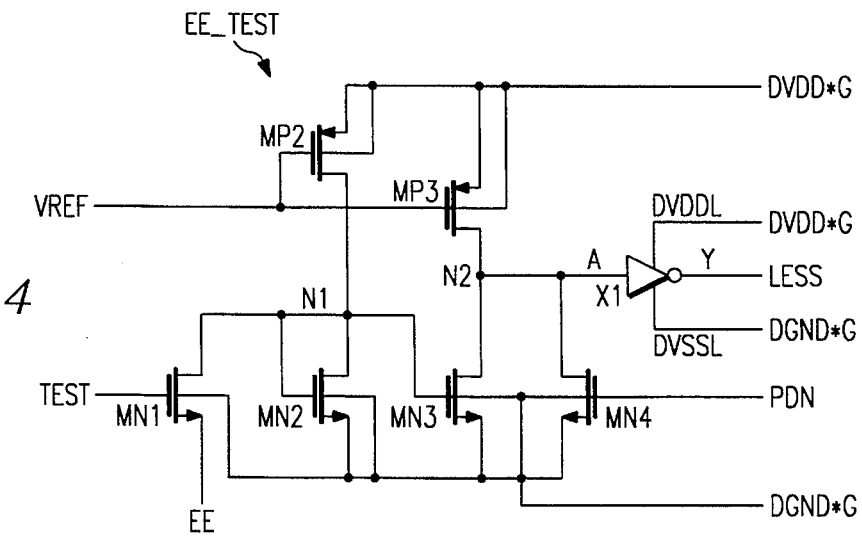
FIG. 14 shows a test amplifier used in the full sense circuit of FIG. 13.
FIG. 16 is a schematic of a EEPROM cell designed for stand-alone operation rather than arrayed operation.

In FIG. 13, when TESTI is high (and TESTIZ low) a test mode is activated. The main sense amplifier is disconnected from the DATA and DATAZ lines and test amplifiers X1 or X2 are enabled instead. FIG. 14 is an electrical schematic of test amplifier EE_TEST. The amplifier compares the current sunk by an external current sink and hooked up to the EE terminal to a reference current, determined by bias line VREF. The value of VREF determines the current through PMOS transistor MP2. NMOS transistor MN1 is a pass transistor, enabled when TEST is high. When the current to be compared exceeds the reference current, node N1 goes low. Otherwise, N1 goes high. However, diode-connected NMOS MN2 prevents N1 from going all the way up to the positive supply. This avoids excessive source-drain voltage in the EEPROM device being sensed. Transistors MP3 and MN3 form a second stage of gain and inverter Y1 a third stage. NMOS transistor MN4 is added to prevent floating nodes during power-down and is not part of the actual operation.

In FIG. 13, when the test mode is selected and LEFTI is high (LEFTIZ low), the current sunk from the DATA node (left EEPROM device) is compared to the fixed reference current, using test amplifier X1. The result of the comparison is placed on the databus DB. When the test mode is selected and RIGHTI is high (RIGHTIZ low), the current sunk from the DATAZ node (right EEPROM device) is compared to the fixed reference current, using test amplifier X2. The result of the comparison is placed on the databus DB.

The COL_SENSE schematic of FIG. 13 thus provides powerful test and characterization possibilities for the EEPROM devices. In addition to being read differentially (normal mode of operation, TESTI low), each EECELL can be read in a single-ended way as well. The current of either the left or the right EEPROM device of any given EEPROM cell can be compared against the reference current. The reference current can be controlled by varying the VREF input. Meanwhile, the sense voltage, VTEST, of each EEPROM cell (FIG. 10) can be varied as well. Since this VTEST defines the gate-source voltage at which the EEPROM devices within the array are read, the possibility is provided to generate I/V curves (current/voltage relationships) for each and every EEPROM device in the array. This makes it possible to determine the absolute threshold voltage ($V_T$) of each EEPROM device in the array, both before and after programming. The effective $V_T$ is a measure for future data retention.

Figure 15A:
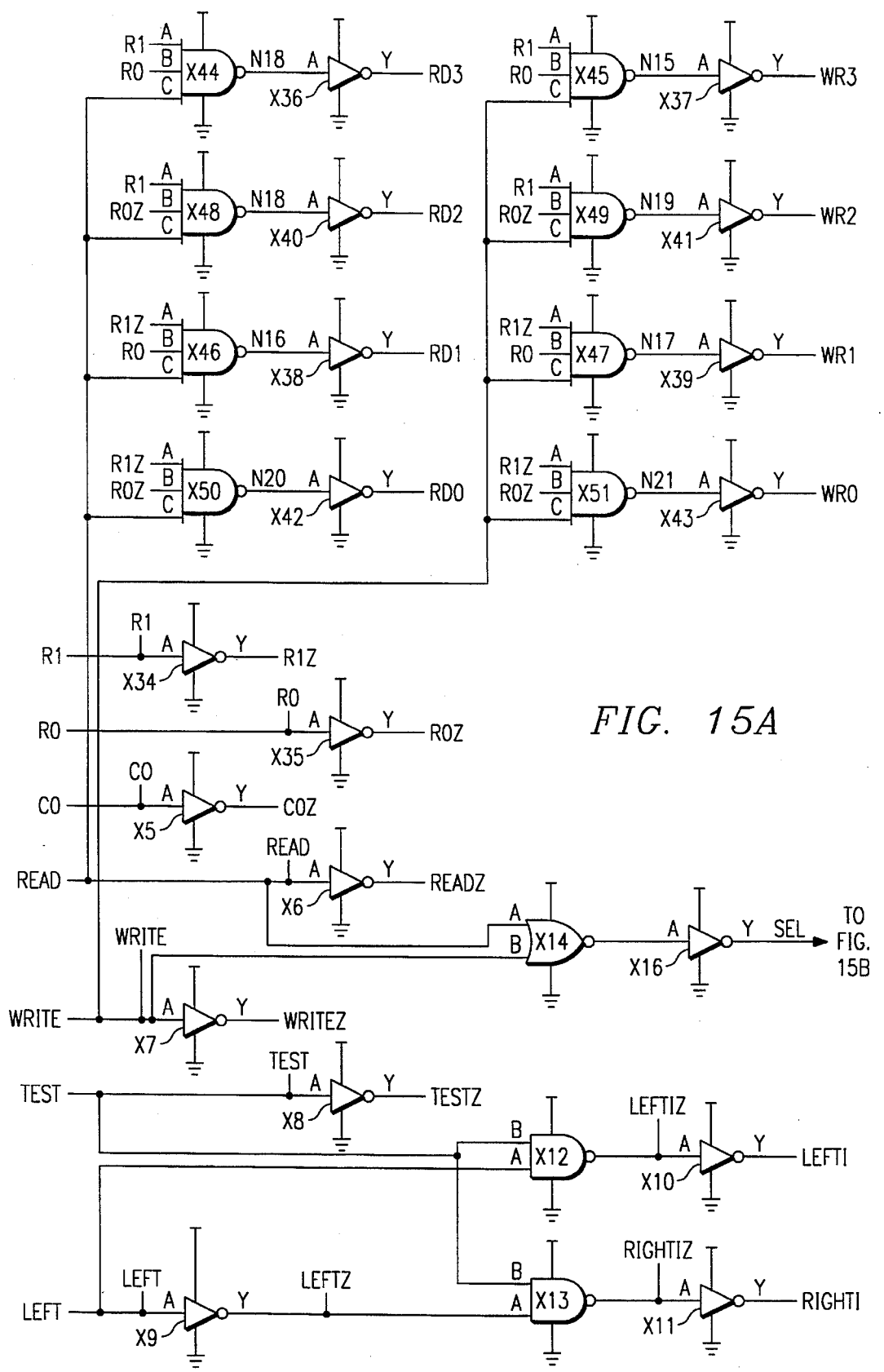
FIG. 15 shows an example of a 4 by 4 bit EEPROM array.
Figure 15B:
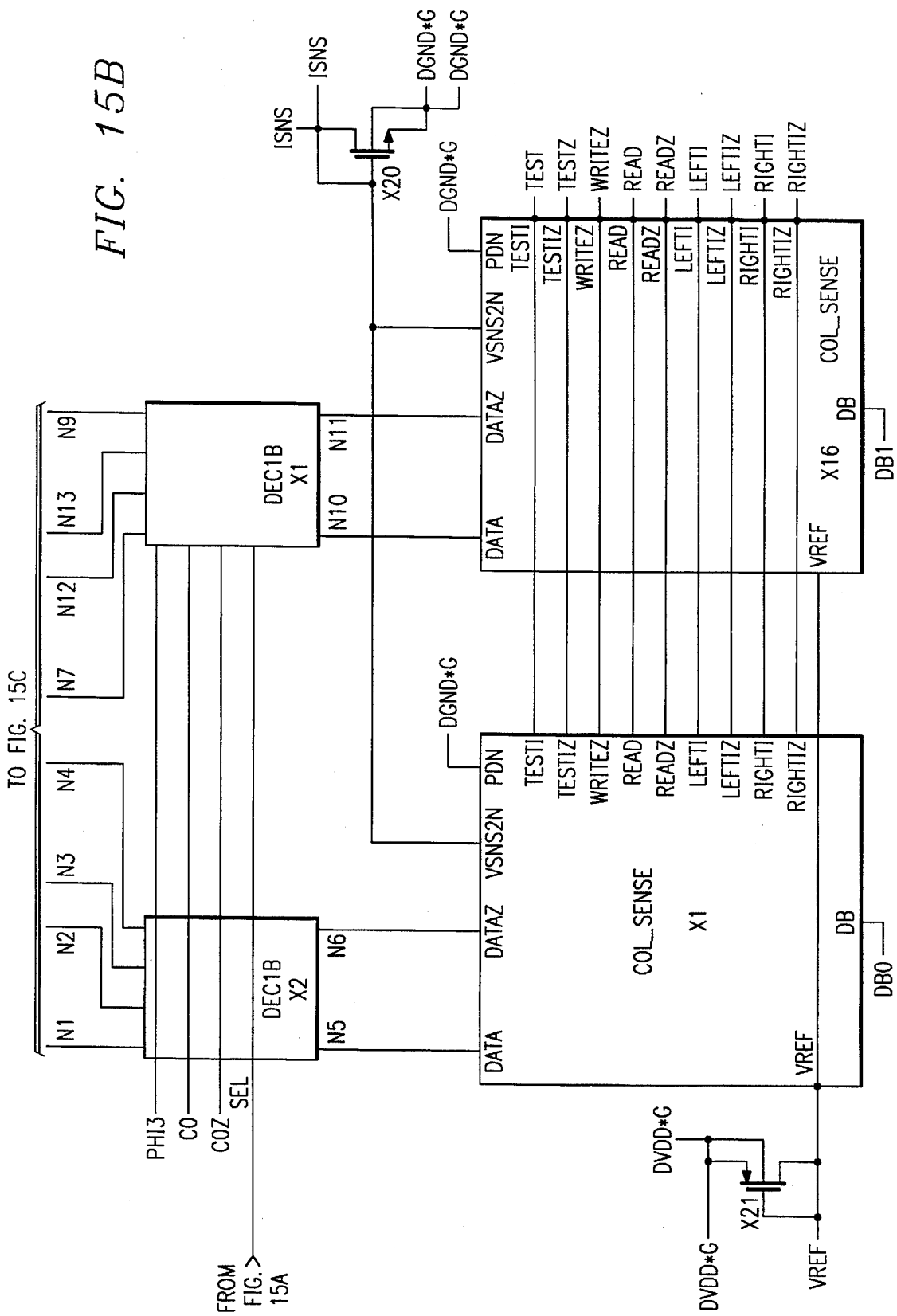
Figure 15C:
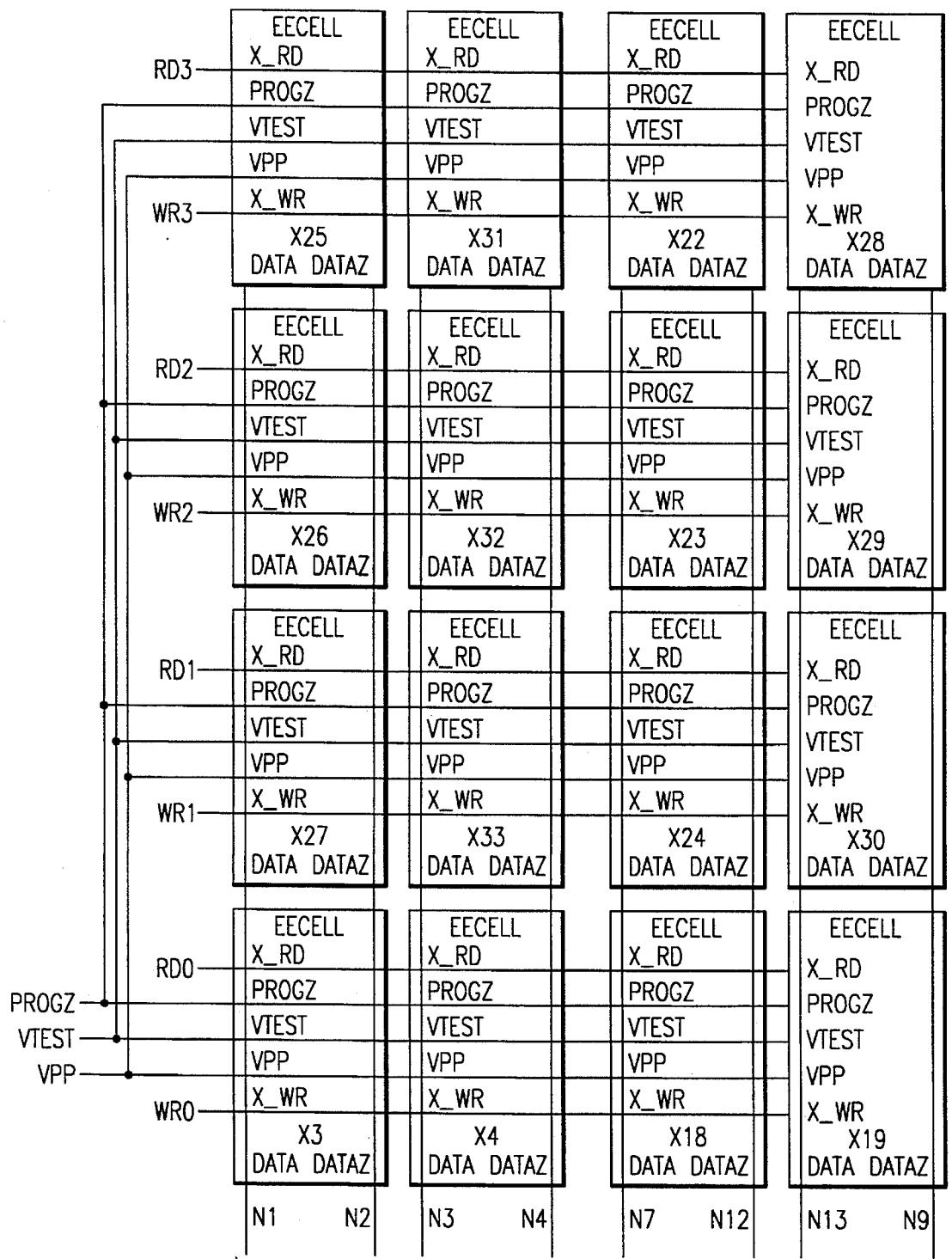

FIG. 15 shows an example of a complete 4 by 4 bits EEPROM array. The array is organized as two sets of two columns, each set being connected to one bit of the data bus, using the column sense circuitry shown in FIG. 13. Which of the two columns is addressed, is determined by the column decoders (implemented using NMOS pass transistors), controlled by the C0 signal. Separate row decoders for read and write mode select one of the 4 rows.

FIG. 16 shows an embodiment of a EEPROM cell based on the same concepts as discussed above, but designed for stand-alone rather than arrayed operation. This cell is useful when only a few bits of EEPROM memory are required in a circuit, or when a larger number of bits needs to be available in a parallel fashion (e.g. calibration data).

The bottom part of FIG. 16 is comparable to the array cell of FIG. 10. Two inputs are used to change the state of the static CMOS latch, WR0 and WR1. The latch itself (back-to-back inverters X1 and X2) double as level-shifters, like in the array version. When PROGZ is low (and VDD is made high), the status of the latch is copied into the two cross-coupled EEPROM devices. When PROGZ is high, the gates of the EEPROM devices are shorted to VTEST. The top of the schematic is the read circuitry. It is similar to the one used in the array cell of the prior art. Since this single cell is not read through long column lines, no pre-charging is required and there is no concern about excessive source-drain voltage in the EEPROM devices.

In FIG. 16, DATA and DATAZ lines are still provided for the sake of testability. These terminals can be shared by a large number of stand-alone cells. When the TEST line of a particular cell is asserted (high) and the corresponding READ line is low, the EEPROM devices are connected to DATA and DATAZ, and they can be sensed by test circuitry similar to the one described for the array cell. This again allows I/V characterization of every EEPROM device in the circuit.

While the preferred embodiment of the EEPROM cell illustrated in FIG. 10 utilizes cross coupled EEPROM transistors for differential sensing of the logic levels, one of the EEPROM transistors could be replaced by a fixed threshold transistor, a fixed current source or a fixed resistor for single ended sensing. This would allow such reference device to be located external to the memory array such as, for example, by the sense amplifier.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. An improved electrically erasable programmable read only memory (EEPROM), comprising:
    a EEPROM transistor pair, each transistor having a programming terminal;
    a static random access memory (SRAM) coupled to the EEPROM transistor pair; and
    a threshold voltage ($V_T$) test measurement line coupled to the EEPROM transistor pair.

2. The improved EEPROM of claim 1 wherein a first pair of complementary metal oxide semiconductor (CMOS) transistors couples the $V_T$ measurement line to the programming terminals of the EEPROM transistors.

3. The improved EEPROM of claim 2 wherein a second pair of CMOS transistors couples the SRAM to the programming terminals of the EEPROM transistors.

4. A differential non-volatile EEPROM memory cell comprising:
    two column lines;
    a static latch having two back-to-back logic inverters, using a programming voltage as their supply voltage, connected to the two column lines through two first transmission gates for writing and/or reading of the latch;
    two EEPROM devices, each having a source and a drain connection, a floating gate, a programming terminal capacitively coupled to the floating gate through a comparatively large tunnel capacitor and a programming terminal capacitively coupled to the floating gate through a comparatively small tunnel capacitor, the EEPROM devices being connected so that their programming terminals with comparatively large tunnel capacitor and programming terminals with comparatively small tunnel capacitors are cross-coupled;
    two second transmission gates connecting the outputs of the two back-to-back inverters to the two cross-coupled programming terminals of the EEPROM devices, these transmission gates being on when the cell is to be programmed; and
    two third transmission gates connecting the two cross-coupled programming terminals of the EEPROM devices to a single test voltage, these transmission gates being on when the cell is to be read.

5. The differential non-volatile EEPROM memory cell of claim 4, wherein the drains of the two EEPROM devices are connected to the column lines through two fourth transmission gates, these fourth transmission gates being on when the cell is to be read.

6. A differential non-volatile EEPROM memory cell comprising two column lines
    a static latch with differential outputs, using a programming voltage as its supply voltage;
    two EEPROM devices, each having a source and a drain connection, a floating gate, a programming terminal capacitively coupled to the floating gate through a comparatively large tunnel capacitor and a programming terminal capacitively coupled to the floating gate through a comparatively small tunnel capacitor, these EEPROM devices being connected so that their programming terminals with comparatively large tunnel capacitor and programming terminals with comparatively small tunnel capacitors are cross-coupled;

two first transmission gates connecting the outputs of the static latch to the two cross-coupled programming terminals of the EEPROM devices, these transmission gates being on when the cell is to be programmed;

two second transmission gates connecting the two cross-coupled programming terminals of the EEPROM devices to a single test voltage, these transmission gates being on when the cell is to be read; and a sense amplifier connected to the two column lines to determine a logic state of the memory cell based on the comparative current sinking capability of the two EEPROM devices.

7. The differential non-volatile EEPROM memory cell of claim 6, wherein the drains of the two EEPROM devices are connected to lines common with other such memory cells, these transmission gates being on when the cell is to be tested.

* * * * *